United States Patent
Peiter

(10) Patent No.: US 6,877,944 B2
(45) Date of Patent: Apr. 12, 2005

(54) CONFIGURATION FOR TRANSPORTING A SEMICONDUCTOR WAFER CARRIER

(75) Inventor: Martin Peiter, Dresden (DE)

(73) Assignee: Infineon Technologies SC300 GmbH & Co. KG, Erlangen (DE)

( * ) Notice: Subject to any disclaimer, the term of this patent is extended or adjusted under 35 U.S.C. 154(b) by 8 days.

(21) Appl. No.: 10/424,174

(22) Filed: Apr. 25, 2003

(65) Prior Publication Data

US 2003/0190223 A1 Oct. 9, 2003

Related U.S. Application Data

(63) Continuation of application No. PCT/EP01/11355, filed on Oct. 1, 2001.

(30) Foreign Application Priority Data

Oct. 25, 2000 (EP) .............................. 00123165

(51) Int. Cl.⁷ ............................... B65G 1/00
(52) U.S. Cl. ................. 414/279; 414/591; 414/940; 198/465.2
(58) Field of Search ............... 414/279, 591, 414/940; 198/465.2, 465.4; 104/107, 118, 307

(56) References Cited

U.S. PATENT DOCUMENTS

| 5,980,183 A | 11/1999 | Fosnight |
| 6,280,134 B1 | 8/2001 | Nering |
| 6,364,593 B1 * | 4/2002 | Hofmeister et al. ...... 414/217.1 |
| 6,481,558 B1 | 11/2002 | Bonora et al. |
| 6,602,038 B2 * | 8/2003 | Ahn et al. ................ 414/279 |
| 2004/0109746 A1 * | 6/2004 | Suzuki ...................... 414/373 |

FOREIGN PATENT DOCUMENTS

| WO | WO 98/58402 | 12/1998 |
| WO | WO 00/37338 | 6/2000 |

* cited by examiner

Primary Examiner—Eileen D. Lillis
Assistant Examiner—Charles A. Fox
(74) Attorney, Agent, or Firm—Laurence A. Greenberg; Werner H. Stemer; Ralph E. Locher

(57) ABSTRACT

For bay type structures of semiconductor wafer transport systems, a configuration includes interbay rail tracks and intrabay rail tracks mounted on each other, vehicles of the interbay system and carrier transfer cars of the intrabay system moving freely bi-directional inside the bay area without obstructing each other. The carrier transfer car is configured such that a wafer carrier can be directly loaded from the vehicle to the load port of a processing machine. The configuration simplifies and accelerates the transfer and enhances the flexibility of vehicles in wafer transport.

19 Claims, 3 Drawing Sheets

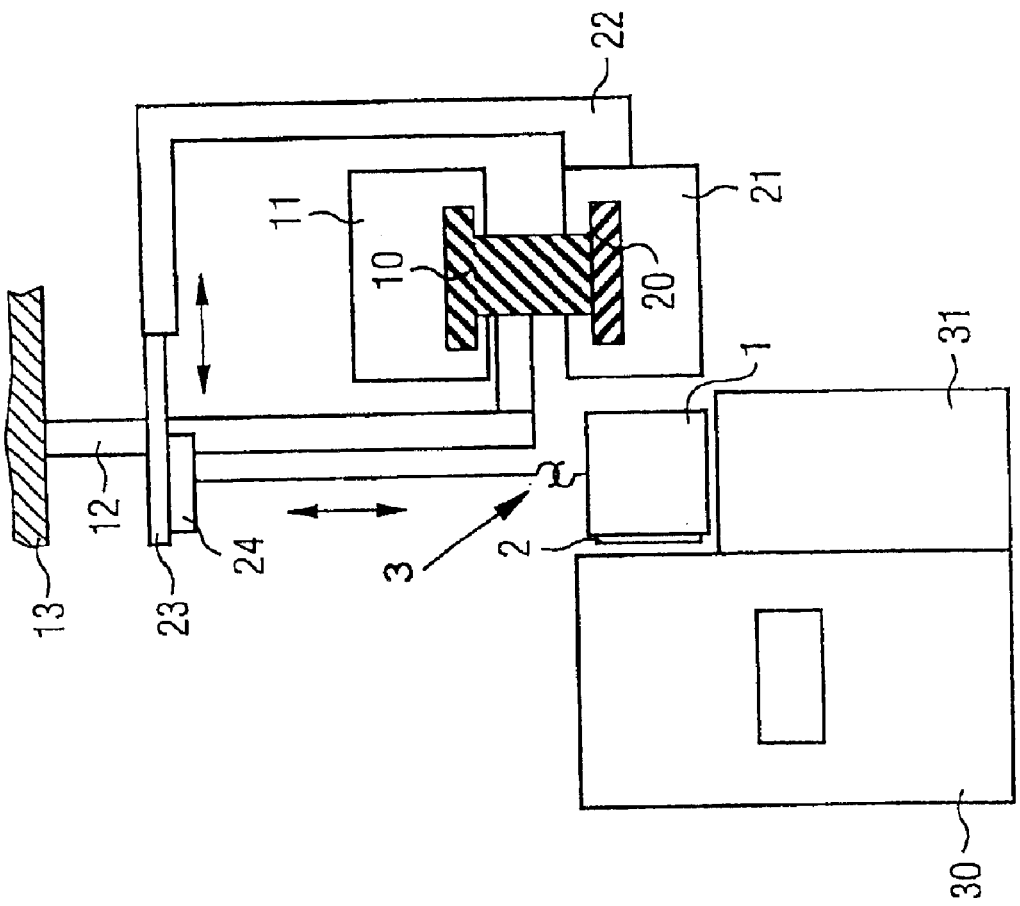
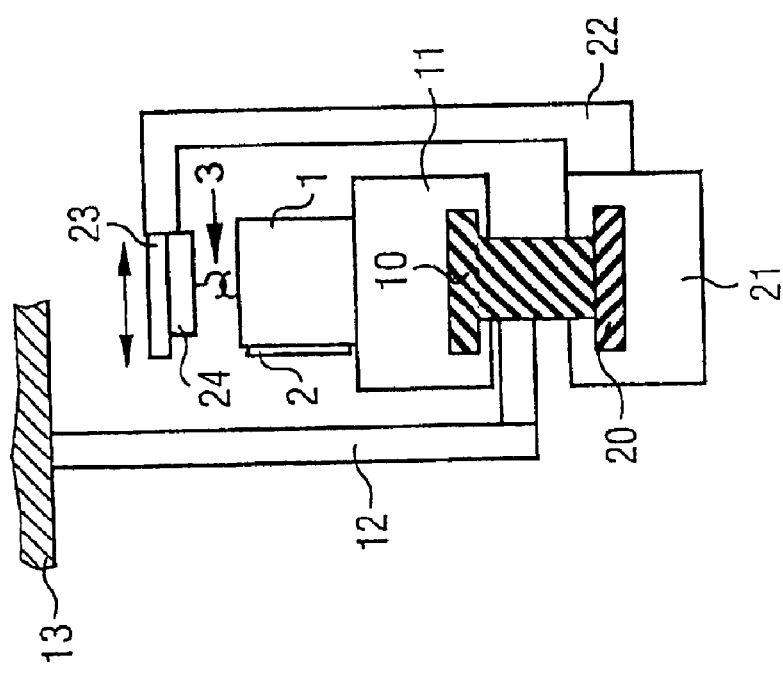

CONFIGURATION FOR TRANSPORTING A SEMICONDUCTOR WAFER CARRIER

CROSS-REFERENCE TO RELATED APPLICATION

This application is a continuation of copending International application PCT/EP01/11355, filed Oct. 1, 2001, which designated the United States and which was published in English.

BACKGROUND OF THE INVENTION

Field of the Invention

The present invention relates to a configuration for transporting a semiconductor wafer carrier.

In semiconductor device manufacturing systems, in particular, in wafer fabrication, automatic transport systems increasingly accomplish the transfers of device carriers (such as wafer cassettes, also called carriers), which contain a number of devices, e.g., wafers, in between subsequent fabrication process steps. A commonly used structure is the organization of manufacturing systems into bay type areas inside a cleanroom. Processing machines of the same kind are condensed into bays to combine machine specific chemical and electrical supply, and to give operators short distances to attend the machines, and, in particular, to simplify transport systems because lots processed on different machines of the same kind remain spatially together.

Usually, transport systems include interbay systems, which connect all the bay areas throughout the fabrication system, and intrabay systems that include an annular rail track inside the bay area, with the functionality of receiving wafer carriers from interbay vehicles through stocker equipment, and of transferring the wafer using carrier transfer cars to a free load port of any unused processing machine and vice-versa. The stocker equipment serves for transposing the wafer carriers between the different systems, whereby on-top-vehicles are often used for the interbay rail tracks. The carrier transfer cars move to the processing machines, where individual wafer handlers load the load ports of the processing machines or operators perform such a task manually.

With decreasing cycle times of the processing machines and increasing cleanroom specifications the non-value-added costs due to travel time and the footprint of transport equipment in the cleanroom area become important for wafer fabrication costs. In case of the manufacturing systems being heavily loaded, long waiting times can arise at the stocker equipment or at the load port of the processing machines. Vehicles involved in transposing their carrier load may obstruct other vehicles, which are to pass the aforementioned bottleneck, i.e., stocker equipment or the load port. Moreover, stocker equipment requires expensive footprint in the cleanroom area and has to offer high availability, resulting in increased costs for service.

In International Publication WO 98/58402, corresponding to U.S. Pat. No. 6,280,134 to Nering, there is disclosed an apparatus for automated cassette handling, wherein the apparatus provides the functionality of receiving cassettes or carriers from a conveyor. The conveyor extends through an inner portion of an elevator chamber of the apparatus, from where it can be lifted by an elevator onto a position, where a wafer handler can load the processing chamber of the attached processing machine. The apparatus enables a passage of a following second wafer carrier without obstruction by the first wafer carrier in process, thus avoiding the build-up of queues in front of the apparatus. Nevertheless, the transport system is restricted to conveyor lines, and, thus, lacks the flexibility of dynamically loading different machines with disposable transfer mechanisms as in the case of carrier transfer cars of the common intrabay system.

In International Publication WO 00/37338, corresponding to U.S. Pat. No. 6,481,558 to Bonora et al., an intrabay system having a transfer assembly for elevating and displacing a wafer carrier from an intrabay conveyor towards a storage buffer adjacent to the conveyor is suggested. A further unit, a delivery robot, may later—when tool capacity is available—redistribute the wafer carriers from the storage buffer to the loadports of the processing tools. The delivery robot is provided with a vertical and horizontal motion being mounted independently from the intrabay system at the ceiling, and is intended to each serve two loadports adjacent to the storage buffer.

In U.S. Pat. No. 5,980,183 to Fosnight, an intrabay buffer and delivery system is provided, according to which shuttles receive wafer carriers from the interbay system at an entrance to the intrabay point thereby serving as a stocker, and store them in buffer shelves within the bay when needed, the wafer carriers are transferred to loadport positions by the shuttles being equipped with grippers. The shuttles are mounted on guide rails being disposable along the guide rail tracks within the bay.

These two configurations also lack flexibility, because several load/unload actions to and from stocker equipment or storage buffer are still necessary.

SUMMARY OF THE INVENTION

It is accordingly an object of the invention to provide a configuration for transporting a semiconductor wafer carrier in wafer fabrication processes that overcomes the hereinafore-mentioned disadvantages of the heretofore-known devices of this general type and that reduces the amount of travel and load or unload times between subsequent processing steps, and where less transport equipment is necessary to transport semiconductor wafers to the processing machines.

With the foregoing and other objects in view, there is provided, in accordance with the invention, a configuration for transporting a semiconductor wafer carrier, including an interbay transport configuration for connecting a plurality of bays each having processing machines with load ports, the interbay transport configuration having an interbay rail track and a vehicle moving on the interbay rail track for transferring the wafer carrier between different bays according to a processing sequence, and an intrabay transport configuration having an intrabay rail track reaching into areas of the bays and, thereby, passing each of the processing machines, the intrabay rail track being mounted along the interbay rail track within a bay area and a carrier transfer car moving on the intrabay rail track within the bay area for transferring the wafer carrier between the interbay transport configuration and the processing machines, the carrier transfer car being freely disposable along the intrabay rail track and having a hoist arm with a wafer carrier moving device for lifting up or down the wafer carrier and for depositing the wafer carrier on a load port of one of the processing machines, the hoist arm disposed to leave a free carrier load space between the vehicle and the hoist arm and permit the vehicle transferring the wafer carrier and the carrier transfer car to pass each other without mutual obstruction on a respective one of the interbay rail track and the intrabay rail track. Alternatively, the carrier transfer car has a hoist arm with means for lifting up or down the wafer carrier and for depositing the wafer carrier on a load port of one of the processing machines.

A configuration for transporting a semiconductor wafer carrier includes an interbay transport configuration having an interbay rail track with vehicles moving on the tracks, for connecting a plurality of bays, the vehicle for transferring the wafer carrier between different bays according to their processing sequence, an intrabay transport configuration including an intrabay rail track with a carrier transfer car being freely disposable along the track within the bay area, for transferring the wafer carrier between the interbay transport configuration, and the processing machines, the interbay rail track reaching into the bay area, thereby passing each of the processing machines, and the intrabay rail track, which is mounted along the interbay rail track within the bay area, the carrier transfer car having a hoist arm with measures for lifting up or down the carrier and for depositing the wafer carrier on the load port of one of the processing machines, whereby the hoist arm is configured to leave a free carrier load space between the vehicle and the hoist arm, for enabling the vehicle carrying the wafer carrier and the carrier transfer car to pass each other without mutual obstruction on their tracks.

With the objects of the invention in view, there is also provided a configuration for transporting at least one semiconductor wafer carrier, including an interbay transport configuration for connecting a plurality of bays each having processing machines with load ports, the interbay transport configuration having an interbay rail track and at least one vehicle moving on the interbay rail track for transferring the wafer carrier between different bays according to a processing sequence, and an intrabay transport configuration having an intrabay rail track reaching into areas of the bays and, thereby, passing at least one processing machine, the intrabay rail track being mounted along the interbay rail track within a bay area and a carrier transfer car moving on the intrabay rail track within the bay area for transferring the wafer carrier between the interbay transport configuration and at least one processing machine, the carrier transfer car being freely disposable along the intrabay rail track and having a hoist arm with a wafer carrier moving device for lifting up or down the wafer carrier and for depositing the wafer carrier on the load port of one of the processing machines, the hoist arm disposed to leave a free carrier load space between the vehicle and the hoist arm and permit the vehicle transferring the wafer carrier and the carrier transfer car to pass each other without mutual obstruction on a respective one of the interbay rail track and the intrabay rail track.

According to the present invention, a configuration is provided, that significantly reduces the time needed to transfer a semiconductor wafer carrier from a first to a second processing machine within an intrabay. The interbay rail tracks are led into and completely through the bay area to enable the vehicles of the interbay transport configuration to bring their carrier load directly in front of the processing machine that is due to perform the next process step in the wafer fabrication sequence.

At such a location, the vehicle can meet a carrier transfer car of the intrabay transport configuration, which performs the task to receive the wafer carrier and to direct the load to the load port of the processing machine. Thereby, the stocker step, i.e., the transfer of the wafer carrier between interbay and intrabay configuration, and the loading step of the processing machine can be carried out in just one movement, thus, saving time and reducing the amount of bottleneck locations.

Further improvement in throughput arises from the improved functionality, that two or more vehicles can enter the bay area within a comparatively small time difference such that many processing machines can be loaded in parallel, depending on the number of vehicles used. Besides the transfer velocity improvement, saving of costs can be additionally gained, because most of the transport throughput inside the bay area can be achieved by the use of cheaper interbay vehicles, whereas less numerous but expensive carrier transfer cars can be required due to their dynamical flexibility.

The vehicle and the carrier transfer car can meet anywhere in the bay area because both tracks are mounted on each other and the carrier transfer car can move to any place along the intrabay rail track. Even in the case of all load ports in the present bay being occupied, the vehicle can deliver its carrier load to a carrier transfer car at a non-load-position and then being free to receive another transfer task, while just the carrier transfer car waits for a free load port. Thus, free vehicle capacity for the interbay configuration is retained.

The hoist arm mounted on the carrier transfer car supplies the versatility of performing the load and transfer tasks without obstructing either the interbay rail track construction or the vehicle, which can pass through the carrier transfer car position. For the reason that both the vehicle with load and the carrier transfer car cannot obstruct each other, there is extensive room for a planning and optimization procedure, depending on how many vehicles, carrier transfer cars, and free load ports are available in the bay area, thus, keeping a desired balance between occupied vehicles and carrier transfer cars. For example, if vehicles are urgently needed in other areas, they quickly release their carrier load to carrier transfer cars at a non-load-position in the bay entrance area and resume their path to a new operational area.

The kind of attachment of the intrabay rail track to the interbay rail track may be chosen such that the intrabay rail track is mounted separately from the interbay rail track on the cleanroom hall structure, preferably, on the ceiling. Such a construction offers the possibility of a partly independent intrabay rail track guidance. For example, carrier transfer car service areas or parking positions can be provided.

The intrabay rail tracks can, as well, be directly mounted on the interbay rail track, which reduces the amount of expensive and obstructing support constructions. Relative spaces between both track systems are, then, guaranteed to be constant along the mounted track.

In accordance with another feature of the invention, there is provided an extendable hoist arm for the carrier transfer car, which achieves a fast removal of the wafer carrier from the wafer carrier load space above the vehicle. The hoist arm can be extended into a position, where the wafer carrier cannot obstruct with other wafer carriers being deposited on top of another vehicle that passes through the present location of the carrier transfer car. This feature further improves the flexibility of the intrabay transport configuration.

In accordance with a further feature of the invention, the extension device of the hoist arm is constructed such as to reach a position above the load port of the processing machine, from where the wafer carrier can be directly lifted down to the load port, thus, rendering special load port equipment superfluous.

Analogously, the hoist arm can be configured as a gripper arm that can be extended. It takes the wafer carrier with the gripper, removes the carrier from the load space, and, then, extends down to the load port with the improvement, that horizontal movements can be achieved. For instance, special barriers can be circumvented or load ports of processing machines can be reached, which are shifted relative to the rail tracks.

In accordance with an added feature of the invention, there is provided a winch and rope as the mechanism to lift and deposit the wafer carrier from the vehicle to the load port and vice-versa. Such construction offers a simple and cost-saving solution to perform the transfer.

In accordance with an additional feature of the invention, there is provided a bi-directional driving functionality of both vehicles and cars independently from each other, enabling dispatched vehicles to find the shortest way out of the bay area to resume another task, thus, increasing the general availability of interbay vehicles.

In accordance with yet another feature of the invention, there are provided junctions for the bay, each junction employing switches for entering or exiting the bay area with any combination of direction. A portion of the interbay rail track is supplied, which enables the vehicle to skip the current bay area and to continue on an interbay route. Alternatively, the vehicle can enter the bay area through the switches into the second portion of the interbay transport configuration, which is the bay area portion of the interbay rail track.

Preferably, an annular interbay and intrabay rail track layout within the bay is provided with two junctions within the ring both connecting the bay area rail tracks with the external interbay transport configuration. The locations of the two junctions correspond to prior art stocker port positions. Thus, an entrance and an exit junction are implied, but the meaning of both junctions can also be exchanged because vehicles can move bi-directional on their tracks and switches.

This allows for flexible dispatching of vehicles into and out of the bay area.

In case the vehicle can enter the intrabay area through two junctions inside the annular ring of the bay area, the problem of wafer carrier orientations on the vehicle is solved by two further aspects. The first aspect is that junctions are supplied with switches, which have controllers to rotate the wafer carrier on top of the vehicle. If the vehicle passes the switch into the bay area, the orientation of the wafer carrier doors can be detected automatically and can be compared with the information about the position of the processing machines along the track behind the switch inside the bay area. If the orientation of the wafer carrier door is opposite to the load port of one of the processing machines, all wafer carriers on top of the on-top-vehicles can be rotated by 180 degrees. Such a feature renders manual operator attendance unnecessary when loading the load port of the processing machine. A mechanical implementation as well as an electronic realization are feasible.

The second aspect deals with rotating the whole platform, on which the wafer carriers are deposited on top of the on-top-vehicles, instead of individual wafer carriers, thereby reducing the complexity of the rotating equipment. The wafer carriers are fixed on the platform, all having the same wafer carrier door orientations. If the vehicle enters the bay area through the switch, the automatic detection and rotation process acts on the platform as a whole. The measures for rotating the wafer carrier or the platform according to both aspects can be mounted on the vehicle or externally.

In accordance with yet a further feature of the invention, the carrier transfer car can cross the switches of the interbay rail track system. This feature results in the aspect, that carrier transfer cars can reach remote areas. E.g., intrabay rail tracks can be mounted on interbay rail tracks beyond the switches outside the bay area for enabling the carrier transfer cars to serve processing machines outside of any bay area or in other bays. This gives the advantage that carrier transfer cars can be concentrated throughout the fabrication system just where they are needed, thereby reducing the total number of carrier transfer cars required for the fabrication system.

In accordance with a concomitant feature of the invention, the intrabay rail track is mounted directly beneath the interbay rail track with the carrier transfer cars moving on the intrabay rail track in a floating rail type as well beneath the vehicles, which, in this aspect, are called on-top-vehicles. The carrier transfer cars are provided with hoist arms, which lead around the guide-rail to a position above the on-top-vehicles, the whole configuration saving efficiently space due to the rare use of support arms, the compact construction of both guide-rails and the hoist arm fitting in with the interbay rail structure. Moreover, the height above ground of the construction reduces footprint of the transport configuration.

Other features that are considered as characteristic for the invention are set forth in the appended claims.

Although the invention is illustrated and described herein as embodied in a configuration for transporting a semiconductor wafer carrier, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1A is a partial side view and partial, fragmentary, cross-sectional view of a carrier transfer car according to the invention with a hoist arm latching to the connector on top of a wafer carrier;

FIG. 1B is a partial side view and partial, fragmentary, cross-sectional view of a carrier transfer car according to the invention with an extended hoist arm depositing the wafer carrier on a load-port of a processing machine;

DESCRIPTION OF THE PREFERRED EMBODIMENTS

Figure 2:
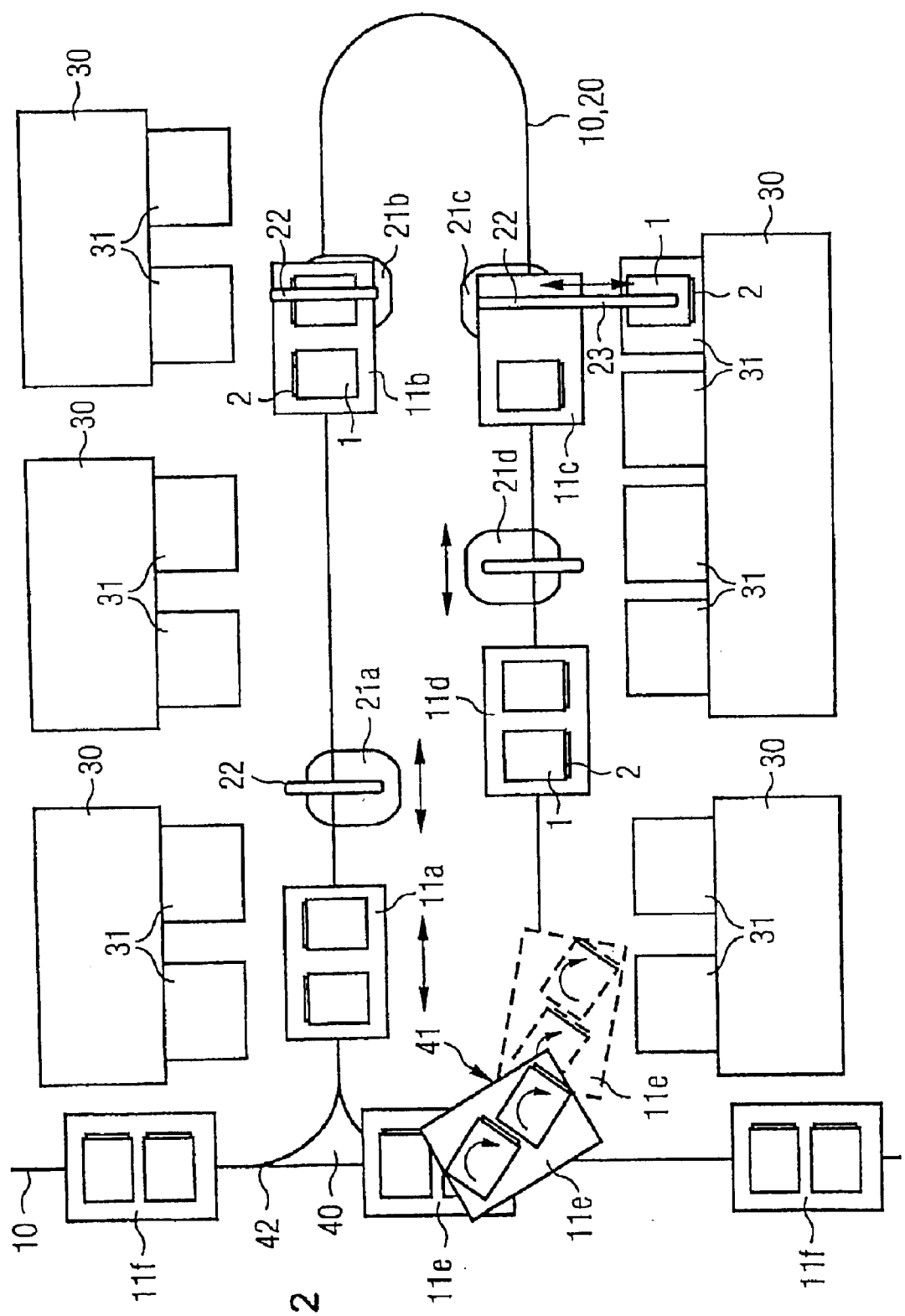
FIG. 2 is a fragmentary, plan view of an interbay area according to the invention with vehicles moving on the interbay rail track and carrier transfer cars moving on the intrabay rail track.

Referring now to the figures of the drawings in detail and first, particularly to FIG. 1A thereof, there is shown a remotely controlled vehicle 11, which moves on a T-shaped guide-rail representing the interbay rail track 10, thereby carrying the wafer carrier 1. The T-shaped guide-rail track is mounted on support arms 12, which are mounted on the ceiling 13. The whole system represents an overhead transport system. Beneath the T-shaped guide-rail track 10 another guide-rail is horizontally flanged representing the intrabay rail track 20. A carrier transfer car 21 is moving in a floating rail type beneath this guide-rail track 20 along the interbay rail track 10. A crane-type hoist arm 22 is mounted on the carrier transfer car 21 at the opposite side of the support arms 12, which hold the rail tracks 10 and 20. The top of the hoist arm 22 is provided with a winch and rope structure 24 that latches on to a connector 3 on top of the wafer carrier 1. In the specific situation displayed in FIG. 1B, the carrier transfer car 21 and the on-top-vehicle 11 have already met to start the transfer of the wafer carrier. The crane-type hoist arm 22 is mounted off-axis of the rail tracks 10 and 20 and leads around the rail tracks to a top position beneath the ceiling 13 sufficiently high above the vehicle platform to give passage to a vehicle loaded with a wafer carrier 1.

Ideally, the transfer happens in front of a processing machine 30 having a load port 31 in front of it, which is shown in FIG. 1B. The hoist arm 22 has an extendable arm 23 on its top, which can be extended to reach a position above the load port 31 using the winch and rope 24. The wafer carrier 1 can be lifted down onto the load port 31 with the wafer carrier door 2 orientated into a loading position for the process chamber of the processing machine 30. After this moment displayed in the figure, the vehicle 11 can already resume its path to search for another task. Additionally, other vehicles can pass through the current position where the carrier transfer car 21 is still busy with depositing the wafer carrier 1.

The two situations given in FIG. 1 are shown for the same preferred embodiment in a top view in FIG. 2. Several vehicles 11a–11c are moving along the interbay rail track 10 inside the bay area to reach their destined load ports 31. The vehicles 11b and 11c are already in load position and represent the situations shown in FIG. 1A for vehicle 11b and FIG. 1B for vehicle 11c, where carrier transfer cars 21b and 21c serve the transfer. Vehicle 11a already found its destined position at a load port 31 in front of a processing machine 30, and the carrier transfer car 21a is about to reach the location. Vehicle 11d and carrier transfer car 21d is, as well, about to meet a free load port 31.

Because the embodiment according to the present invention gives room for a planning and optimization scheme, time can be saved and resources can be enhanced if, for example, carrier transfer car 21d skips and passes through vehicle 11d and meets with vehicle 11e, which is just entering the bay area at another load port being the destined position of vehicle 11e. Such a situation can arise due to the possibility that carrier transfer car 21c is just about to finish serving the transfer between vehicle 11c and its load port 31. Then, carrier transfer car 21c will move to the neighboring position of vehicle 11d and serve that transfer while vehicle 11c is starting to leave the bay area by moving counter-clockwise through the bay. When it reaches the position of vehicle 11b, the latter vehicle will be released from the carrier transfer car 21b having lifted the wafer carrier 1, and both vehicles can transit to the bay exit junction 40. In the mean time, vehicle 11a and carrier transfer car 21a will have conducted the transfer and all three vehicles 11a, 11b, and 11c can pass through junction 40.

An advantage of such an embodiment according to the present invention is that there exist two junctions 40 and 41 that connect the intrabay system containing the interbay rail tracks 10 and the intrabay rail tracks 20, and the interbay system having the interbay rail track 10. With the functionality of all cars and vehicles moving, bi-directional queuing can be avoided by using the optimum path in and out of the bay area.

The wafer carrier transfer according to this embodiment can still be accelerated by attaching electrical or mechanical devices to switches 42 of the junctions 40 and 41 and the vehicles 11, which automatically rotate the wafer carriers 1 on top of the vehicle lie in order to align the wafer carrier door 2 with the load ports 31. Each of the switches and the vehicles has a tool with which it can deduce an orientation of the wafer carrier 1 of the current vehicle 11e. The device compares the detected orientation with locally stored information about whether the load ports 31 along the rail track 10 and 20 beyond the switch 42 are attached left or right to the rail track. The tool, then, has the feasibility to decide whether to rotate the wafer carrier 1 or not. According to this embodiment, the decision will be accomplished by a computer network-based manufacturing execution system.

Figure 3A:
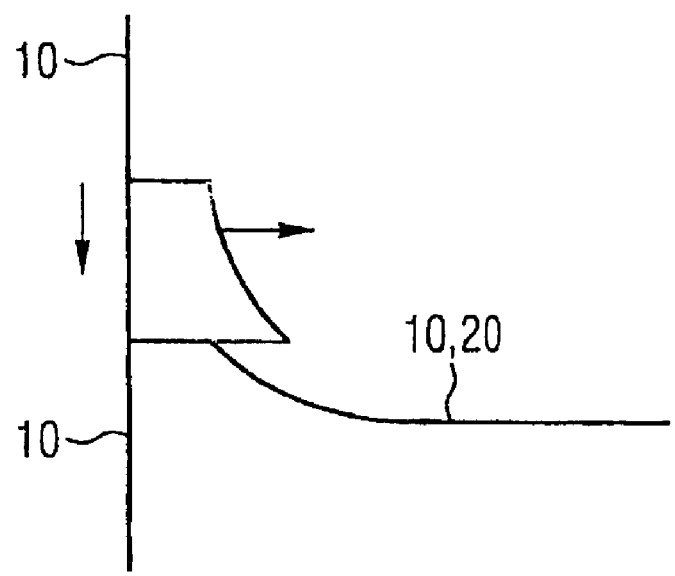
FIGS. 3A and 3B are diagrammatic, fragmentary, plan views of a switch according to the invention with a disposable insertion in a straight-ahead position in FIG. 3A and in a turn-left position in FIG. 3B.
Figure 3B:
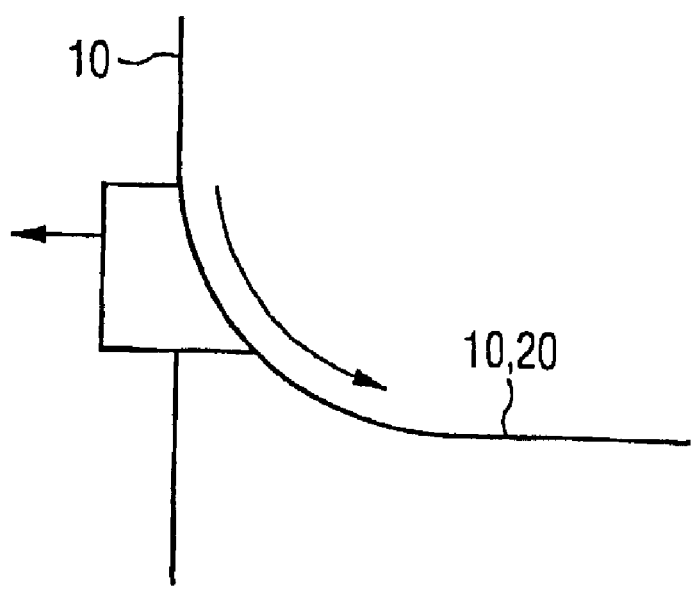

This embodiment deals with switches 42 that include insertions that can be disposed perpendicular to the interbay rail track diagrammatically shown in FIGS. 3A and 3B. In the position of the switch 42 shown in FIG. 3A, the vehicle 11f of FIG. 2 will move straight ahead and skip the bay area. Accordingly, when the switch 42 is in the position represented in FIG. 3B, vehicle 11f will turn left.

I claim:

1. A configuration for transporting a semiconductor wafer carrier, comprising:
    an interbay transport configuration for connecting a plurality of bays each having processing machines with load ports, said interbay transport configuration having:
        an interbay rail track; and
        a vehicle moving on said interbay rail track for transferring the wafer carrier between different bays according to a processing sequence; and
    an intrabay transport configuration having:
        an intrabay rail track reaching into areas of the bays and, thereby, passing each of the processing machines, said intrabay rail track being mounted along said interbay rail track within a bay area and being operatively connected to said interbay rail track at the bay area, said vehicle, thereby, selectively moving within the bay area on said intrabay rail track; and
        a carrier transfer car moving on said intrabay rail track within the bay area for transferring the wafer carrier between said interbay transport configuration and the processing machines, said carrier transfer car being freely disposable along said intrabay rail track and having a hoist arm with a wafer carrier moving device for lifting up or down the wafer carrier and for depositing the wafer carrier on a load port of one of the processing machines, said hoist arm disposed to leave a free carrier load space between said vehicle and said hoist arm and permit said vehicle transferring the wafer carrier and said carrier transfer car to pass each other without mutual obstruction on a respective one of said interbay rail track and said intrabay rail track.

2. The configuration according to claim 1, wherein said hoist arm moves a lifted first wafer carrier out of said carrier load space above said vehicle into a position where said vehicle carrying a second wafer carrier can freely pass said carrier transfer car.

3. The configuration according to claim 1, wherein said hoist arm lifts the wafer carrier down to the load port of the processing machine.

4. The configuration according to claim 1, wherein said hoist arm has a winch and a rope for lifting the wafer carrier.

5. The configuration according to claim 1, wherein said wafer carrier moving device is a winch and a robe for lifting the wafer carrier.

6. The configuration according to claim 1, wherein said vehicle and said carrier transfer car each independently move in both directions along said interbay rail track and said intrabay rail track without obstructing one another.

7. The configuration according to claim 1, wherein:

said vehicle is a plurality of vehicles;

said carrier transfer car is a plurality of carrier transfer cars; and said vehicles and said carrier transfer cars independently move in both directions along said interbay rail track and said intrabay rail track without obstructing one another.

8. The configuration according to claim 1, wherein said interbay rail track has:

a first portion connecting the bays;

a second portion reaching into the bay area and being operatively connected to said interbay rail track at the bay area; and a junction connecting said first and second portion, said junction having switches branching said vehicle on said first portion off to said second portion when traveling in either direction and moving said vehicle on said second portion to enter said first portion in either direction.

9. The configuration according to claim 8, wherein:

said vehicle has a wafer carrier rotation device; and said junction has a controller controlling said wafer carrier rotation device when said vehicle passes over at least the one of said switches.

10. The configuration according to claim 8, wherein:

said vehicle has means for rotating the wafer carrier; and said junction has means for controlling rotation of the wafer carrier when said vehicle passes over at least one of said switches.

11. The configuration according to claim 8, wherein:

said vehicle has a rotatable platform;

a wafer carrier is fixed on said platform; and said junction has a control device rotating said platform with said wafer carrier when said vehicle passes over at least one of said switches.

12. The configuration according to claim 8, wherein:

said vehicle has a rotatable platform to fixedly receive the wafer carrier thereon; and said junction has a control device rotating said platform with the wafer carrier when said vehicle passes over at least one of said switches.

13. The configuration according to claim 8, wherein:

said vehicle has a rotatable platform to fixedly receive the wafer carrier thereon; and said junction has means for rotating said platform with the wafer carrier when said vehicle passes over at least one of said switches.

14. The configuration according to claim 8, wherein:

said intrabay rail track is mounted along said interbay rail track beyond the bay area to allow said carrier transfer car to load or unload a single processing machine positioned in another bay or outside any of the bays and to exchange a carrier transfer car with another one of the bay areas, and said switches have a device turning said hoist arms down upon entering or exiting the bay area.

15. The configuration according to claim 8, wherein:

said intrabay rail track is mounted along said interbay rail track beyond the bay area to allow said carrier transfer car to load or unload a single processing machine positioned in another bay or outside any of the bays and to exchange a carrier transfer car with another one of the bay areas; and said switches have means for turning said hoist arms down upon entering or exiting the bay area.

16. The configuration according to claim 8, wherein:

said carrier transfer car is a plurality of carrier transfer cars;

said intrabay rail track is a plurality of intrabay rail tracks;

said interbay rail track is a plurality of interbay rail tracks; and said intrabay rail tracks are mounted along said interbay rail tracks beyond the bay area to allow said carrier transfer cars to load or unload single processing machines positioned in another bay or outside any of the bays and to exchange a carrier transfer cars with another one of the bay areas; and said switches have devices turning said hoist arms down upon entering or exiting the bay area.

17. The configuration according to claim 1, wherein:

said intrabay rail track is mounted beneath said interbay rail track;

said vehicle moves on top of said interbay rail track; and said carrier transfer car moves below said vehicle and has said hoist arm extending above said vehicle.

18. A configuration for transporting a semiconductor wafer carrier, comprising:

an interbay transport configuration for connecting a plurality of bays each having processing machines with load ports, said interbay transport configuration having:

an interbay rail track; and a vehicle moving on said interbay rail track for transferring the wafer carrier between different bays according to a processing sequence; and an intrabay transport configuration having:

an intrabay rail track reaching into areas of the bays and, thereby, passing each of the processing machines, said intrabay rail track being mounted along said interbay rail track within a bay area and being operatively connected to said interbay rail track at the bay area, said vehicle, thereby, selectively moving within the bay area on said intrabay rail track; and; and a carrier transfer car moving on said intrabay rail track within the bay area for transferring the wafer carrier between said interbay transport configuration and the processing machines, said carrier transfer car being freely disposable along said intrabay rail track and having a hoist arm with means for lifting up on down the wafer carrier and for depositing the wafer carrier on a load port of one of the processing machines, said hoist arm disposed to leave a free carrier load space between said vehicle and said hoist arm and permit said vehicle transferring the wafer carrier and said carrier transfer car to pass each other without mutual obstruction on a respective one of said interbay rail track and said intrabay rail track.

19. A configuration for transporting at least one semiconductor wafer carrier, comprising:

an interbay transport configuration for connecting a plurality of bays each having processing machines with load ports, said interbay transport configuration having:

an interbay rail track; and at least one vehicle moving on said interbay rail track for transferring the wafer carrier between different bays according to a processing sequence; and an intrabay transport configuration having:
- an intrabay rail track reaching into areas of the bays and, thereby, passing at least one processing machine, said intrabay rail track being mounted along said interbay rail track within a bay area and being operatively connected to said interbay rail track at the bay area, said vehicle, thereby, selectively moving within the bay area on said intrabay rail track; and
- a carrier transfer car moving on said intrabay rail track within the bay area for transferring the wafer carrier between said interbay transport configuration and at least one processing machine, said carrier transfer car being freely disposable along said intrabay rail track and having a hoist arm with a wafer carrier moving device for lifting up or down the wafer carrier and for depositing the wafer carrier on the load port of one of the processing machines, said hoist arm disposed to leave a free carrier load space between said vehicle and said hoist arm and permit said vehicle transferring the wafer carrier and said carrier transfer car to pass each other without mutual obstruction on a respective one of said interbay rail track and said intrabay rail track.

* * * * *